United States Patent [19]

Newman et al.

[11] Patent Number: 4,545,840

[45] Date of Patent: Oct. 8, 1985

[54] PROCESS FOR CONTROLLING THICKNESS OF DIE ATTACH ADHESIVE

[75] Inventors: Robert Newman, San Jose; Fred Johnson, Sunnyvale, both of Calif.

[73] Assignee: Monolithic Memories, Inc., Santa Clara, Calif.

[21] Appl. No.: 473,310

[22] Filed: Mar. 8, 1983

[51] Int. Cl.[4] .............................................. B32B 31/00
[52] U.S. Cl. ...................................... 156/276; 29/589; 65/43; 156/325; 156/330.9
[58] Field of Search ...................... 156/276, 307.5, 320, 156/330.9, 325; 428/328, 120; 29/589; 420/570, 577; 65/43; 252/512; 524/439, 440; 174/52 FP

[56] References Cited

U.S. PATENT DOCUMENTS

| | | | |
|---|---|---|---|
| 2,335,615 | 11/1943 | Strasser | 420/577 |
| 3,406,053 | 10/1968 | Jaenicke | 156/306.9 |
| 3,655,482 | 4/1972 | Schildkraut et al. | 156/276 |
| 3,795,047 | 3/1974 | Abolafia et al. | 29/625 |
| 3,923,581 | 12/1975 | Payne et al. | 156/291 |
| 4,083,718 | 4/1978 | Murabayashi et al. | 75/134 B |
| 4,129,881 | 12/1978 | Reichel et al. | 357/82 |
| 4,157,273 | 6/1979 | Brady | 156/315 |

Primary Examiner—John J. Gallagher
Attorney, Agent, or Firm—Steven F. Caserza; Alan H. MacPherson; Thomas S. MacDonald

[57] ABSTRACT

A semiconductor die attach adhesive is provided which is formed of a plurality of spacers formed in a suspension of silver filled glass. In one embodiment of this invention, the spacers are spheres. The spacers utilized in one embodiment of this invention have a melting temperature below the temperature at which the solvents are evaporated from the die attach adhesive. In this manner, as the solvents are driven from the silver filled glass during the die attach operation, thus causing the volume of the silver filled glass to decrease, the spacers utilized in this invention partially melt, thus decreasing their thickness. This decreased thickness of the spacers decreases the separation between the die and the substrate, thus preventing the formation of voids within the die attach adhesive. In one embodiment, the spacers are formed of a lead/tin alloy. In another embodiment of this invention, the spacers are formed of a lead/tin/bismuth alloy, and in yet another embodiment of this invention the spacers are formed of lead/tin/bismuth eutectic.

11 Claims, 9 Drawing Figures

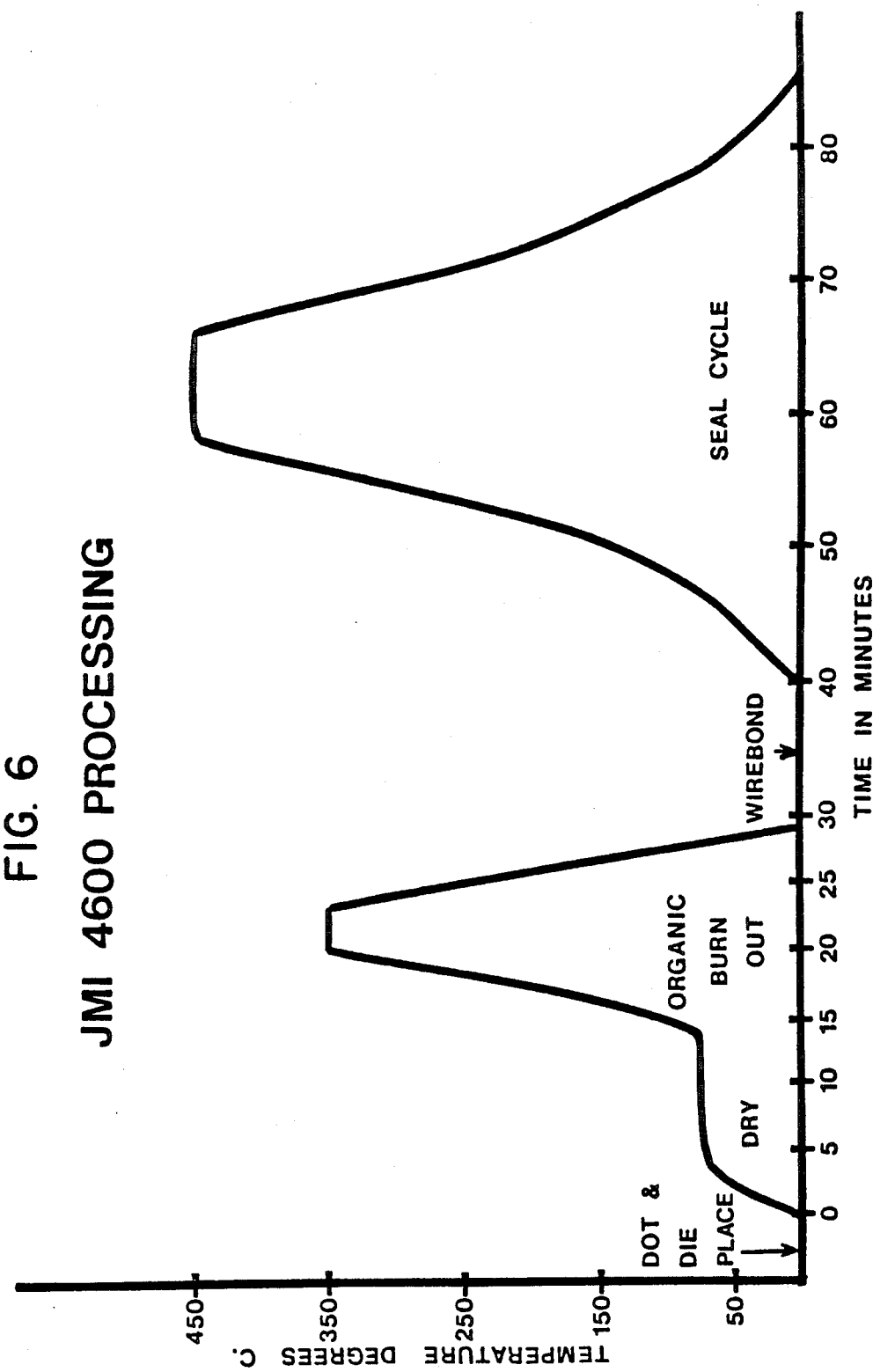

PROCESS FOR CONTROLLING THICKNESS OF DIE ATTACH ADHESIVE

BACKGROUND OF THE INVENTION

1. Field of the Invention

This invention relates to semiconductor devices, and more particularly to methods for attaching a semiconductor die to a substrate (commonly referred to as "die attach").

2. Description of the Prior Art

Methods for attaching semiconductor dice to substrates are well known in the prior art. As shown on FIG. 1, a semiconductor die 13, which may be, for example, either a transistor or a complex integrated circuit device, often measuring approximately 15 mils in thickness (1 mil=0.001 inch) and in excess of 100 mils (0.1 inches) on each side, is attached to substrate surface 19 located within opening 12 of semiconductor package 10. Substrate 19 comprises, for example a ceramic package. As shown in FIG. 1, a plurality of electrically conductive leads 11 are affixed to package 10. After the semiconductor die 13 is attached to substrate surface 19, a plurality of electrical "bonding wires", typically comprising aluminum or gold wire having a diameter of approximately 1 mil (0.001 inches), are attached between specified locations (often referred to as "bonding pads") on the surface of semiconductor die 13 and selected leads 11, thus providing electrical connections between regions of semiconductor die 13 and external circuitry (not shown) connected to leads 11. These wires are typically connected to the bonding pads and leads 11 by mechanical and thermal welding.

A cross-sectional view of semiconductor die 13 attached to substrate surface 19 is shown in FIG. 2. As shown in FIG. 2, an adhesive die attach material 14 is located between semiconductor 13 and substrate 19.

A good die attach is essential for several reasons. First, the die attach must affix the die 13 firmly to substrate 19 during the life of the device. Should the die 13 become separated from substrate 19, the aforementioned bonding wires may break or short, thus causing an electrical failure of the device. That die 13 remain firmly affixed to substrate 19 is important regardless of the use to which the device is to be put, but is much more so in military and aerospace applications, where the package 10 is sometimes subjected to very high stresses and impact forces. For this reason, stringent die attach requirements are provided for semiconductor devices to be used in military applications. These requirements are specified in MIL-STD-750B (transistors) and MIL-STD-883B (integrated circuits). Among these requirements are the minimum forces (i.e. often referred to as the "die shear strength") required to cause the die 13 to shear from substrate 19.

Secondly, the die attach must provide adequate thermal conductivity between semiconductor die 13 and substrate 19 to dissipate the oftentimes large amounts of heat generated by semiconductor die 13. This thermal conductivity is typically measured as the rise in temperature of the die per watt dissipated by the die (i.e., °C./watt). For many transistors, such heat or power dissipation requirements are within the range of approximately 0.25 to 5.0 watts; for many high speed, complex integrated circuits, the power dissipation requirements are within the range of approximately 2.0 to 3.0 watts. Since the operation of the device is in major part dependent on its temperature, the die attach must provide a sufficiently low thermal resistance to the flow of heat generated by semiconductor die 13 to substrate 19, thereby maintaining the temperature of the die 13 within its specified operating temperature range. Substrate 19 in turn conducts heat to the package exterior which in turn conducts heat to the ambient surrounding package 10 (FIG. 1).

Thirdly, the die attach must oftentimes provide a good electrical connection between the backside of semiconductor die 13 and substrate 19. In these cases, it is important to have good electrical conductivity from the backside of the die to an electrically conductive cavity in the packages. This is achieved, for example, by connecting one of the leads 11 to the metallization in the cavity where the die attach is made. In order to provide backside electrical connection, the die attach medium must be electrically conductive.

Accordingly, a semiconductor device is considered adequately attached to the base of the package cavity when it passes a combination of mechanical, thermal and electrical requirements which reflect the expected operating conditions of the semiconductor device. There must be little or no mechanical stress resulting from the die attach process, and little or no stress concentrations from the die attach medium, as these stresses could result in cracking or chipping of the die. Failure of the die attachment often causes the device to cease functioning. Mechanical failure of the die attachment results in a lifted die, which may result in failure of bond wires and failure of backside electrical contact, as well as poor thermal operating characteristics.

One die attach method is gold-silicon eutectic die attach, which utilizes a gold-silicon alloy to weld the semiconductor die to the substrate. To accomplish this, the substrate needs to be treated with a material which will allow a weldment to be made to the substrate, and the backside of the die needs to have an appropriate finish and chemical composition. For the substrate, which is usually alumina or beryllia, a thin layer of gold and glass is fired onto the die attach cavity base, resulting in a surface rich in metallic gold to which a weld may be made. In order to provide sufficient gold to alloy to the die and form a strong weld to the base, gold-silicon eutectic preforms are added and allowed to melt on the treated surface of the base prior to placing the silicon die in the cavity. After the die is placed in the cavity, it is mechanically moved parallel to the surface and allowed to wet to the molten alloy. After the die is wet and positioned, it is left at the elevated temperature for several seconds to complete the process and thus finish the die attach operation. Two difficulties with this process are that a significant amount of time is required to manually complete the die attach operation, and the use of significant amounts of precious metal is quite expensive.

In order to overcome the high expense associated with the use of gold in die attach operations, die attach utilizing organic and inorganic high temperature glues, such as glues containing polyimide and polyimide-amide compounds have been used. These glues are temperature resistant to the extent they can withstand temperatures of approximately 450° C. for periods up to 15 minutes, but tend to degrade rapidly with time at elevated temperatures. EPO-TEK P-10, sold by Epoxy Technology, Inc. of Billerica, MA is typical of the silver filled polyimides/amides used for die attach. By utilizing silver filled polyimides in place of gold, the expenses of the die attach operation is significantly reduced. However, such polyimides used in the die attach operation are organic compounds which decompose to yield moisture at high temperatures such as those generated during hermetic sealing of packages after die attach.

A graphical representation of the relative die shear strength as a function of thickness of the polyimide die attach adhesive is shown in FIG. 3a.

Another adhesive suitable for use as a die attach adhesive is silver filled glass, such as the paste-like product number JMI4600 manufactured and sold by Johnson Mathey Inc. of San Diego. JMI4600 comprises approximately, by weight, 16% glass, 64% silver and 19% organic binders and solvent. When utilizing silver filled glass as a die attach adhesive, a small amount of the silver filled glass is applied to a substrate and a semiconductor die placed thereon. The substrate, die, and die attach adhesive are then elevated to approximately 70° C. in order to cause the evaporation of the solvents contained within the silver filled glass adhesive. Burning off of the organic solvents and sintering is then achieved by raising the temperature to approximately 350° C. Conductive lead wires are then attached or "bonded" between leads on the package or substrate and selected locations on the surface of the die. The package lid is placed on and sealed to the substrate during a seal process at approximately 470° C. If desired, the solvent evaporation step, and the glass melting step of the die attach operation when utilizing silver filled glass, is accomplished by passing the package, die, and adhesive combination through a furnace on a conveyer belt. The combination structure passes through different zones of the furnace thus providing the desired time and temperature "profile" required to first perform the solvent evaporation step, and secondly the glass melting step of the die attach operation. Such a temperature profile used for JMI4600 is shown in FIG. 6. Although terpineol, having a boiling point in excess of 120° C., is used as the solvent in JMI4600, the solvent evaporation step is performed at a temperature less than 120° C. to provide a uniform solvent evaporation. The use of glass as a die attach adhesive overcomes the disadvantages of the polyimide die attach adhesive in that glass is inorganic and does not give off appreciable moisture. The use of silver in the glass provides good thermal and electrical conductivity of the die attach adhesive. However, the relative die shear strength of the glass die attach adhesive is highly susceptible to variations in the glass die attach adhesive thickness. As shown in FIG. 3b, the relative die shear strength when utilizing silver filled glass die attach adhesive is maximum with a glass thickness of approximately 0.002–0.006 inches. For glass thicknesses of less than 0.002 or greater than approximately 0.006 inches, the relative die shear strength decreases quite rapidly, although sufficient die shear strength is achieved if the thickness of the glass die attach adhesive is maintained within a range of approximately 0.002–0.006 inches. For this reason, when utilizing glass die attach adhesive, the glass thickness must be controlled within a very narrow range centered at approximately 0.004 inches. Such accurate control of the thickness of the glass die attach adhesive over a narrow range of thickness is very difficult and thus glass die attach is not widely used at this time.

Other alloys used for attaching a semiconductor die to package substrates include a zinc-aluminum alloy as described in U.S. Pat. No. 3,956,821 issued May 18, 1976.

Inorganic solder processes include the use of silver/palladium alloys which can achieve good adhesion when used with various glass and glass/metal alloy systems. Often the inorganic systems include rather exotic metallic depositions on the wafer backside and some type of metal/glass or tungsten deposition on the substrate base.

SUMMARY

In accordance with this invention, a die attach adhesive is provided which is formed of a plurality of spacers formed in a suspension of silver filled glass. In one embodiment of this invention, the spacers are spheres. The spacers utilized in one embodiment of this invention have a melting temperature below the temperature at which the solvents are evaporated from the die attach adhesive. In this manner, as the solvents are driven from the silver filled glass during the die attach operation, thus causing the volume of the silver filled glass to decrease, the spacers utilized in this invention partially melt, thus decreasing their thickness. This decreased thickness of the spacers decreases the separation between the die and the substrate, thus preventing the formation of voids within the die attach adhesive.

In accordance with one embodiment of this invention, a suspension of spacers in a silver filled glass adhesive is applied to the substrate during the die attach operation. In another embodiment of this invention, the suspension of spacers in the die attach adhesive is applied to the substrate prior to the die attach operation. In yet another embodiment of this invention, the suspension of spacers in the die attach adhesive is formed on the back of the semiconductor die prior to the die attach operation.

In another embodiment, the spacers are formed of a lead/tin alloy. In another embodiment of this invention, the spacers are formed of a lead/tin/bismuth alloy, and in yet another embodiment of this invention the spacers are formed of lead/tin/bismuth eutectic.

BRIEF DESCRIPTION OF THE DRAWINGS

FIG. 6 is a temperature profile during the die attach operation when utilizing JMI4600 glass die attach adhesive.

DETAILED DESCRIPTION

In accordance with the teachings this invention, the benefits of utilizing a silver filled glass die attach adhesive are achieved while maintaining extremely tight control on the thickness of the silver filled glass die attach adhesive. Furthermore, the thickness of the silver filled glass die attach adhesive is controlled without the formation of voids within the die attach adhesive during the die attach operation.

Figure 4A:
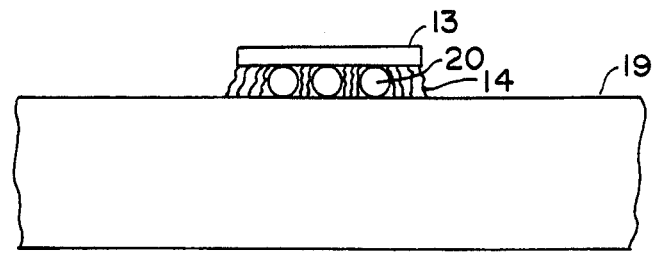
FIG. 4a is a cross-sectional view of a semiconductor die placed on a substrate with a layer of a suspension of glass spheres in silver filled glass placed therebetween in accordance with the teachings of this invention.
Figure 4B:
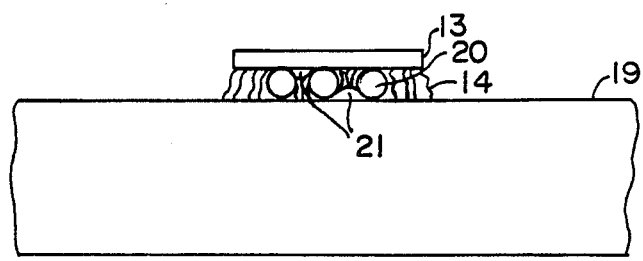
FIG. 4b is a cross-sectional view of a semiconductor die attached to a substrate utilizing a die attach adhesive formed of a suspension of glass spheres in silver filled glass in accordance with this invention.

One technique for controlling the thickness of the glass die attach adhesive in accordance with this invention is depicted in FIGS. 4a and 4b. As shown in FIG. 4a, a mixture of silver filled glass die attach adhesive 14 and spacers 20 is formed. The shape of the spacers 20 is of no significance unless the spacers consume a large percentage of the total adhesive volume. However, if the contact angle between the spacers and either the surface of the die or the substrate is near zero, adhesion may be impaired. In one embodiment, spacers 20 are spheres having a typical diameter of approximately 0.004 inches, the desired thickness of the glass die attach adhesive after die attach. The number of spacers 20 used is small, and as few as 4 to 6 spacers are necessary between the die 13 and substrate 19.

To perform a die attach operation, the adhesive paste is applied to the substrate 19 in an amount sufficient to ensure complete coverage of the backside of die 13 when the die is pushed into place against the spacers 20. Die 13 is then placed thereon with the use of a slight amount of pressure in order to provide the desired thickness of the die attach adhesive formed of silver filled glass 14 and glass spacers 20. The substrate 19, die 13 and adhesive 14 are elevated to approximately 105° C. for approximately 20 minutes to 2 hours and then ramped to approximately 350° C. for approximately 15 to 30 minutes to remove any remaining organic material. The assembly is then, if desired, stored in this state and later further processed at a temperature within the range of approximately 350° C. to 450° C. for approximately 15 to 30 minutes to flow glass and possibly cause some sintering of the metal. Alternatively, this step is performed immediately after the previous step of removing organic material. Further high temperature processing of the die attach assembly is allowed up to 550° C. for package sealing or other purposes without adverse effect on the die attach.

However, as the solvents within silver filled glass 14 are driven off, the volume of silver filled glass 14 decreases. Because glass spacers 20 have a higher melting temperature than that of silver filled glass 14, the thickness of spacers 20 remain constant during the die attach solvent evaporation step. Accordingly, because the volume of silver filled glass 14 decreases during the die attach solvent evaporation step and the thickness of glass spacers 20 remain constant, the separation between semiconductor die 13 and substrate 19 also remains constant, thus causing holes or voids 21 to form within silver filled glass 14. The presence of voids 21 decreases the die shear strength and thermal conductivity between semiconductor die 13 and substrate 19, relative to the shear strength and conductivity of this adhesive when holes or voids 21 are not present.

Figure 5A:
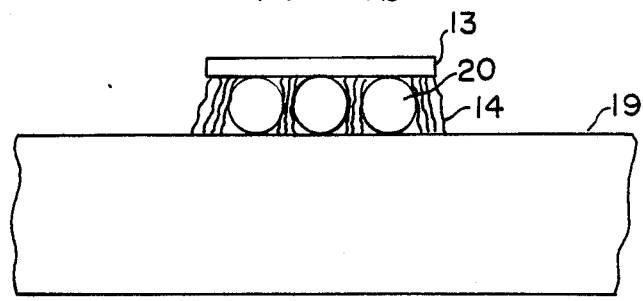
FIG. 5a is a cross-sectional view of a semiconductor die placed in a substrate with a layer of die attach material placed therebetween in accordance with the teachings of this invention.
Figure 5B:
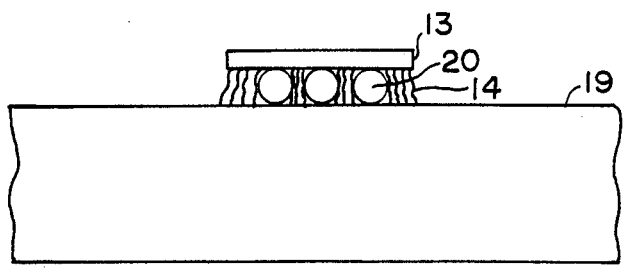
FIG. 5b is a cross-sectional view of a semiconductor die attached to a substrate with a layer of die attach material placed therebetween in accordance with the teachings of this invention.

In accordance with another embodiment of this invention, as shown in FIG. 5a, to attach a semiconductor die to a substrate, semiconductor die 13 is placed on substrate 19 with a layer of silver filled glass 14 and spacers 20 (shown as spheres in FIG. 5a) placed therebetween. Spacers 20 are carefully formed such that they will partially melt or flow at the temperatures used during the die attach operation. As shown in FIG. 5b, after the die attach operation utilizing the die attach adhesive of this invention, the silver filled glass 14 decreases in volume due to the evaporation of solvents contained therein, and spacers 20 change in size. Spacers 20 are carefully selected and formed such that change in size will substantially match the decrease in thickness of silver filled glass 14 due to the decrease in volume of silver filled glass 14 during the solvent evaporation step of the die attach operation. Following this, as shown in FIG. 5b, the die attach operation is completed by subjecting the die 13, substrate 19, silver filled glass 14 and spacers 20 to a temperature in excess of the melting temperature of glass 14 as shown in FIG. 4b, with no voids formed within silver filled glass 14. Thus, utilizing the teachings of this invention, silver filled glass die attach is performed providing a uniformly controlled thickness of the die attach adhesive without the presence of voids in the die attach adhesive. Furthermore, utilizing the teachings of this invention, silver filled glass die attach adhesive is utilized and provides high shear strength, and high thermal and electrical conductivity between die 13 and substrate 19.

In one embodiment of this invention, spacers 20 are formed of low temperature metal alloys, such as alloys including indium, tin, lead or bismuth, such as a lead/tin alloy. In another embodiment of this invention, spacers 20 are formed of a lead/tin/bismuth alloy.

Figure 1:
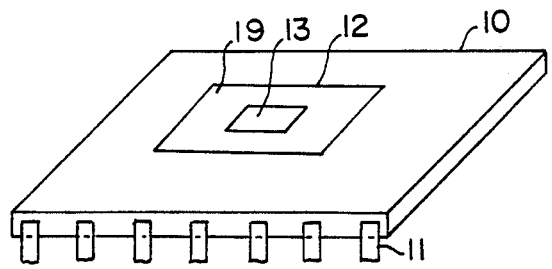
FIG. 1 is a perspective view of a semiconductor die attached in the cavity of a typical semiconductor package or substrate.
Figure 2:
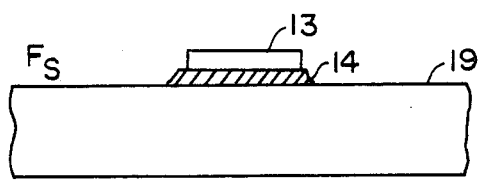
FIG. 2 is a cross-sectional view of a semiconductor die attached to a substrate.
Figure 3B:
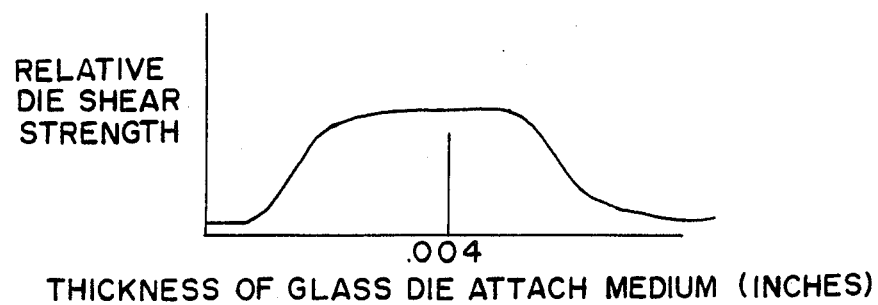
FIG. 3b is a graph of a relative die shear strength versus thickness of glass die attach adhesives.
Figure 3A:
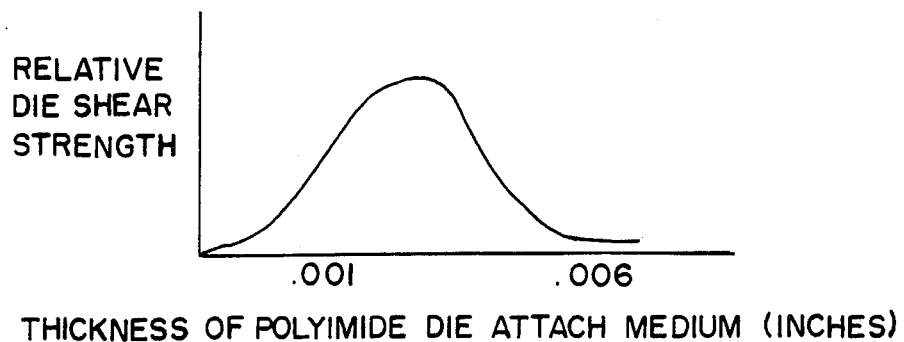
FIG. 3a is a graph of the relative die shear strength versus thickness of polyimide die attach adhesives.

In another embodiment of this invention, spacers 20 are formed of a lead/tin/bismuth eutectic comprising, by weight, approximately 32 percent lead, 15.5 percent tin, and 52.5 percent bismuth, having a melting temperature of approximately 95° C. In one embodiment, this eutectic is formed by combining approximately 100 grams solder consisting of approximately (by weight) 60 percent lead and 40 percent tin, 22.6 grams lead, and 135.5 grams bismuth. It has been found that when the solvent evaporation step of the die attach operation is performed at temperatures of approximately 100° C., the shape of such lead/tin/bismuth eutectic spacers change to provide a space decrease of approximately 20 percent during the solvent evaporation step. Accordingly, when spacers 20 are formed of lead/tin/bismuth eutectic, the diameter of spacers 20 is preferably approximately 5 mils (0.005 inches). In this manner, the thickness of the spacers 20 and silver filled glass 14 after solvent evaporation is held to within a range of approximately 0.0035 to 0.0045 inches, which provides optimum die shear strength, as shown in FIG. 3b.

In one embodiment of this invention, the lead/tin/bismuth eutectic spacers are formed as spheres in a well known manner through the use of a shot tower. The lead/tin/bismuth eutectic is melted and heated to a temperature of approximately 200° C. and poured from a height of approximately 3 meters through a sieve constructed of 60 tyler screen (approximately 9.8 mil mesh spacing) sold by VWR Scientific of San Francisco, CA held approximately 1.5 inches above a bath of ethylene glycol chilled to approximately 0° C. As the molten eutectic passes through the sieve, a plurality of spheres are formed which are immediately quenched by the bath. The spheres are removed from the bath by utilizing a vacuum pump to evaporate the ethylene glycol at between room temperature and 40° C., which is well below the melting temperature of the eutectic spheres. The spheres are then sorted to the desired thickness by first passing through a sieve of 115 tyler screen (approximately 4.9 mils mesh spacing), thus removing spheres having too large diameters, and then removing spheres having too small diameter by passing through a sieve of 150 tyler screen (approximately 4.1 mil mesh spacing), thereby yielding a plurality of spheres of 4-5 mil diameter. The 115 tyler screen and the 150 tyler screen are available, for example, from VWR Scientific of San Francisco, CA.

In one embodiment of this invention, rather dense solvents are utilized in the die attach adhesive mixture in order to keep the spacers utilized in accordance with the teachings of this invention in suspension within the adhesive mixture. Such dense solvents include ethylene glycol (boiling temperature $\approx 200°$ C.) and desinol (boiling temperature $\approx 224°$ C.). These rather dense solvents have rather high boiling temperatures, thus allowing the use of higher temperatures during the solvent evaporation step of a die attach process, as compared with the temperatures used in the solvent evaporation step when solvents having low boiling temperatures are used. By utilizing higher temperatures in the solvent evaporation step, the spacers utilized in accordance with this invention can have increased melting temperatures as compared to when solvents are utilized having lower evaporation temperatures. For example, if a solvent is used which is capable of being driven off at a temperature of approximately 232° C., the spacers utilized in accordance with this invention are, for example, made of tin, having a melting temperature of 232° C., or other higher melting point metals.

While specific embodiments of this invention have been presented in the specification, these specific embodiments are intended to serve by way of example only and are not to be construed as limitations on the scope of this invention. Numerous other embodiments of this invention will become readily apparent to those with ordinary skill in the art in light of the teachings of this specification. For example, the teachings of this invention may be utilized for any type of attachment operation and particularly for an attachment operation requiring precise control of the thickness of the adhesive in the finished product, and this invention is not limited to use in the attachment of semiconductor dice to substrates. Simarly, the glass die attach utilized in this invention need not include silver compounds, if the thermal and electrical conductivity of the adhesive without silver is suitable for its intended purpose. In accordance with the invention, spacers can be used with polyimide and organic adhesives used for attaching semiconductor die to a substrate, or to cause adhesion of any two objects.

We claim:

1. The method for attaching a first structure to a second structure comprising the steps of:
   providing an adhesive composition comprising an adhesive, a solvent, and a plurality of spacer means;
   physically placing said first structure and said second structure on opposite sides of and in contact with a layer of said adhesive composition;
   subjecting said first and second structures and said layer of adhesive composition to a first selected temperature sufficient to cause the evaporation of said solvent from said layer of adhesive composition and greater than or equal to the melting point of said spacer means, thereby causing said spacer means to decrease in thickness,
   subjecting said first and said second structures and said layer of adhesive composition to a second selected temperature greater than said first selected temperature, said second selected temperature being sufficient to cause said layer of adhesive composition to melt; and
   cooling said first and second structures and said layer of adhesive composition to a temperature beneath said second selected temperature, thereby causing said layer of adhesive to solidify, thereby permanently attaching said first structure to said second structure.

2. The method of claim 1 wherein said adhesive comprises a material selected from the group of materials consisting of glass, polyimide and organic adhesives.

3. The method of claim 1 wherein said spacer means comprise an alloy of lead, tin, and bismuth.

4. The method of claim 1 wherein said spacer means comprise a eutectic of, by weight, approximately 32 percent lead, 15.5 percent tin, and 52.5 percent bismuth.

5. The method of claim 1 wherein said solvent comprises a solvent selected from the group of solvents consisting of terpineol, ethylene glycol, desinol, and flourocarbons.

6. The method of claim 1 wherein said spacer means comprise a material selected from the group of materials consisting of lead, tin, bismuth, and glass.

7. The method of claim 1 wherein said step of physically placing comprises the steps of:
   placing said adhesive composition on said first structure; and
   placing said second structure on said adhesive composition.

8. The method of claim 1 wherein said step of physically placing comprises the steps of:
   placing said adhesive composition on said second structure; and
   placing said second structure on said first structure.

9. The method as in claim 1, 5, or 6 wherein said spacer means are spheres.

10. The method of claim 1, 6 or 7 wherein said first structure comprises a substrate and said second structure comprising a semiconductor device.

11. The method as in claim 1 wherein at said first selected temperature said spacer means are deformed such that their thickness decreases by an amount which approximately equals the decrease in thickness of said adhesive composition due to said evaporation of said solvent.

* * * * *